(12) United States Patent
Yasui et al.

(10) Patent No.: US 12,135,247 B2
(45) Date of Patent: Nov. 5, 2024

(54) ELECTROCONDUCTIVE FILM, METHOD FOR MANUFACTURING SAME, TEMPERATURE SENSOR FILM, AND METHOD FOR MANUFACTURING SAME

(71) Applicant: NITTO DENKO CORPORATION, Ibaraki (JP)

(72) Inventors: Satoshi Yasui, Ibaraki (JP); Kazuhiro Nakajima, Ibaraki (JP); Kodai Miyamoto, Ibaraki (JP)

(73) Assignee: NITTO DENKO CORPORATION, Ibaraki (JP)

( * ) Notice: Subject to any disclaimer, the term of this patent is extended or adjusted under 35 U.S.C. 154(b) by 262 days.

(21) Appl. No.: 17/765,070

(22) PCT Filed: Sep. 16, 2020

(86) PCT No.: PCT/JP2020/035027
§ 371 (c)(1),
(2) Date: Mar. 30, 2022

(87) PCT Pub. No.: WO2021/065504
PCT Pub. Date: Apr. 8, 2021

(65) Prior Publication Data
US 2022/0390290 A1    Dec. 8, 2022

(30) Foreign Application Priority Data
Oct. 1, 2019    (JP) ................... 2019-181491

(51) Int. Cl.
G01K 7/18    (2006.01)
G01K 7/16    (2006.01)

(52) U.S. Cl.
CPC ....... *G01K 7/183* (2013.01); *G01K 2007/163* (2013.01); *G01K 2217/00* (2013.01)

(58) Field of Classification Search
CPC ............. G01K 7/183; G01K 2007/163; G01K 2217/00
See application file for complete search history.

(56) References Cited

U.S. PATENT DOCUMENTS 8,568,603 B2 * 10/2013 Tanabe ............... H01B 13/0036
216/13
2008/0043811 A1    2/2008 Thomsen, III
(Continued)

FOREIGN PATENT DOCUMENTS

JP    H11-354302 A    12/1999
JP    2005-91045 A    4/2005
(Continued)

OTHER PUBLICATIONS

Notification of Transmittal of Translation of the International Preliminary Report on Patentability (Form PCT/IB/338) issued in counterpart International Application No. PCT/JP2020/035027 mailed Apr. 14, 2022, with Forms PCT/IB/373 and PCT/ISA/237. (8 pages).

(Continued)

*Primary Examiner* — Kyung S Lee
(74) *Attorney, Agent, or Firm* — WHDA, LLP

(57) ABSTRACT

An electroconductive film (101) comprises a metal thin-film (10) on a first main surface of a flexible substrate (40) that includes a resin film (5). The thickness of the flexible substrate is 1 mm or less. The absolute value $|H_2-H_1|$ of the difference between the heating dimensional change rate $H_1$ of the electroconductive film and the heating dimensional change rate $H_2$ of a film obtained by removing the metal thin-film from the electroconductive film is preferably 0.10% or less. There is a tendency that undulation of a temperature sensor film after patterning of the metal thin-film is further suppressed as the value of $|H_2-H_1|$ decreases.

9 Claims, 3 Drawing Sheets

(56) References Cited

U.S. PATENT DOCUMENTS

| | | | |
|---|---|---|---|
| 2008/0176042 A1* | 7/2008 | Nashiki | G06F 3/044 216/95 |
| 2013/0048597 A1 | 2/2013 | Tanabe et al. | |
| 2014/0027405 A1 | 1/2014 | Tanabe et al. | |
| 2015/0025308 A1 | 9/2015 | Wu et al. | |
| 2015/0253083 A1 | 9/2015 | Wu et al. | |
| 2015/0036238 A1 | 12/2015 | Nagatomo et al. | |
| 2015/0362381 A1 | 12/2015 | Nagatomo et al. | |
| 2018/0023365 A1 | 8/2018 | Bang | |
| 2018/0233651 A1 | 8/2018 | Bang | |
| 2019/0047065 A1 | 2/2019 | Cao et al. | |
| 2022/0404213 A1* | 12/2022 | Nakajima | C23C 14/08 |

FOREIGN PATENT DOCUMENTS

| | | |
|---|---|---|
| JP | 2007-232598 A | 9/2007 |
| JP | 2007-232669 A | 9/2007 |
| JP | 2012-182258 A | 9/2012 |
| JP | 2013-45633 A | 3/2013 |
| TW | 201535524 A | 9/2015 |
| TW | 201804630 A | 2/2018 |
| WO | 92/03833 A2 | 3/1992 |

OTHER PUBLICATIONS

Office Action dated Jan. 9, 2024, issued in counterpart JP Application No. 2019-181491, with English translation. (9 pages).

Office Action dated Aug. 22, 2023, issued in counterpart JP Application No. 2019-181491, with English Translation. (10 pages).

Extended (Supplementary)European Search Report dated Sep. 7, 2023, issued in counterpart EP Application No. 20870680.4. (10 pages).

International Search Report dated Oct. 20, 2020, issued in counterpart International Application No. PCT/JP2020/035027 (3 pages).

Office Action dated May 27, 2024, issued in counterpart TW application No. 109133331, with English translation. (12 pages).

* cited by examiner

FIG. 3A
FIG. 3B
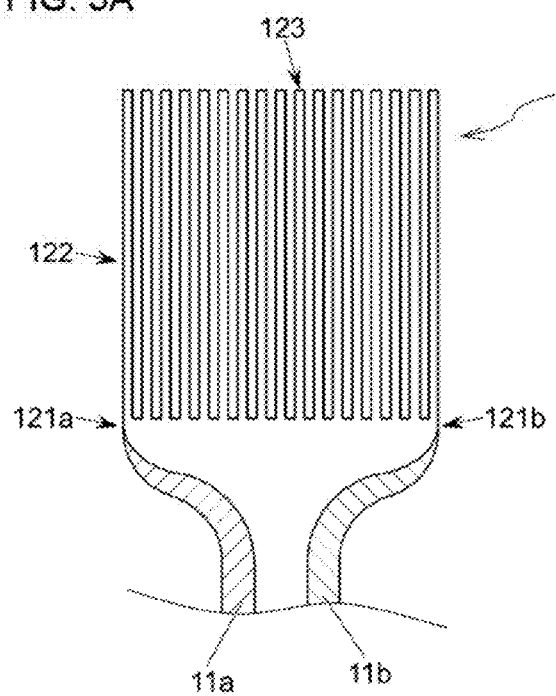
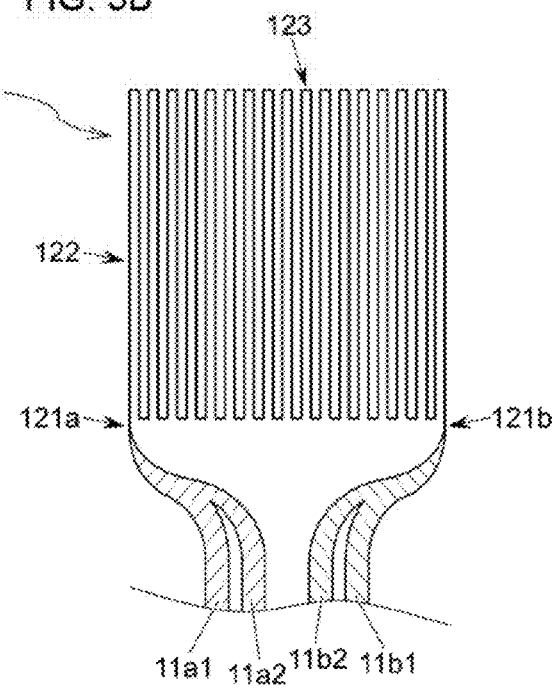
FIG. 4
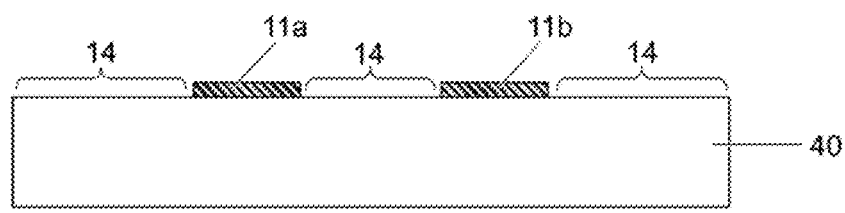
FIG. 5
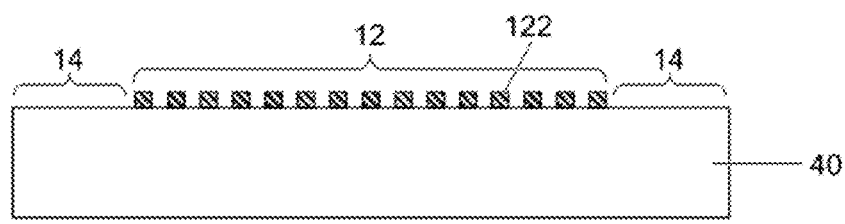

ELECTROCONDUCTIVE FILM, METHOD FOR MANUFACTURING SAME, TEMPERATURE SENSOR FILM, AND METHOD FOR MANUFACTURING SAME

TECHNICAL FIELD

The present invention relates to a temperature sensor film including a patterned metal thin-film formed on a film base. AND an electroconductive film used in production of the temperature sensor film.

BACKGROUND ART

A large number of temperature sensors are used in electronic devices. As the temperature sensor, a thermocouple or a chip thermistor is generally used. In a case where temperatures at a plurality of locations in one plane are measured by a thermocouple, a chip thermistor, or the like, it is required to arrange the temperature sensor at each measurement point and connect the respective temperature sensors to a printed wiring board or the like, resulting in a complicated production process. In addition, in order to measure an in-plane temperature distribution, it is required to arrange a large number of sensors on a substrate, which causes an increase in cost.

Patent Document 1 discloses a temperature sensor film in which a metal thin-film is disposed on a flexible film base and the metal thin-film is patterned to have a lead part 11 and a thermometric resistor part 12 (see FIG. 2). When the metal thin-film is patterned as described above, it is not required to connect individual thermometric sensors by wiring, and thus, it is possible to improve productivity of devices including temperature sensors. In addition, since the flexible substrate is used, there are advantages in that it is easy to make the device flexible and to cope with a large area.

PRIOR ART DOCUMENTS

Patent Documents

Patent Document 1: JP 2005-91045 A

SUMMARY OF THE INVENTION

Problems to be Solved by the Invention

As described above, a temperature sensor film can be formed by patterning an electroconductive film having a metal thin-film on a flexible substrate. However, the film obtained by patterning the metal thin-film has undulation in a patterning region and a periphery thereof and there are concerns that handling becomes difficult, air bubbles are included at a bonding interface when a protective film is bonded to a surface of the temperature sensor film, and the like.

In view of the above, an object of the present invention is to provide a temperature sensor film having a small undulation after patterning a metal thin-film, and to provide an electroconductive film for forming the temperature sensor film.

Means for Solving the Problems

An electroconductive film for a temperature sensor includes a metal thin-film formed on a first principal surface of a flexible substrate that includes a resin film. A thickness of the flexible substrate is 1 mm or less.

The flexible substrate may include a hard coat layer formed on a first principal surface of the resin film. The flexible substrate may include an underlying layer in direct contact with the metal thin-film. The flexible substrate may include a hard coat layer formed on a first principal surface of the resin film and the underlying layer formed on the hard coat layer. The underlying layer preferably includes at least one layer of a silicon-based thin-film, and the metal thin-film is preferably in direct contact with the silicon-based thin-film as the underlying layer.

The metal thin-film may be a nickel-based thin-film formed of nickel or a nickel alloy. A thickness of the metal thin-film is preferably 60 to 200 nm. The metal thin-film is preferably formed by a sputtering method.

An absolute value $|H_2-H_1|$ of a difference between a heating dimensional change rate $H_1$ of the electroconductive film and a heating dimensional change rate $H_2$ of the film obtained by removing the metal thin-film from the electroconductive film is preferably 0.10% or less. As $|H_2-H_1|$ is smaller, the undulation of the temperature sensor film after patterning the metal thin-film tends to be suppressed.

A temperature sensor film can be formed by patterning the metal thin-film of the electroconductive film. The temperature sensor film includes the patterned metal thin-film formed on one principal surface of the flexible substrate, and the metal thin-film is patterned into a thermometric resistor part and a lead part.

The thermometric resistor part is provided in a portion where temperature measurement is performed, and is patterned into a thin wire. The lead part is patterned to have a larger wiring width than that of the thermometric resistor part, and one end of the lead part is connected to the thermometric resistor part. The other end of the lead part is connected to an external circuit or the like. A connector may be connected to the lead part, and the connection to the external circuit may be performed through the connector.

Effects of the Invention

When the absolute value $|H_2-H_1|$ of the difference between the heating dimensional change rate $H_1$ of the electroconductive film and the heating dimensional change rate $H_2$ of the film obtained by removing the metal thin-film from the electroconductive film is small, undulation of the temperature sensor film after patterning the metal thin-film tends to be suppressed. Therefore, handleability of the temperature sensor film is improved. In addition, when a protective film is bonded to the surface of the temperature sensor film, inclusion of air bubbles in the bonding interface can be suppressed.

BRIEF DESCRIPTION OF THE DRAWINGS

FIGS. 3A and 3B are each enlarged view of the vicinity of a thermometric resistor part in a temperature sensor, wherein FIG. 3A indicates a two-wire type and FIG. 3B indicates a four-wire type.

FIG. 4 is a cross-sectional view of the vicinity of the lead part of the temperature sensor film.

FIG. 5 is a cross-sectional view of the vicinity of the thermometric resistor part of the temperature sensor film.

MODE FOR CARRYING OUT THE INVENTION

[Summary of Configuration of Electroconductive Film and Temperature Sensor Film]

Figure 1:
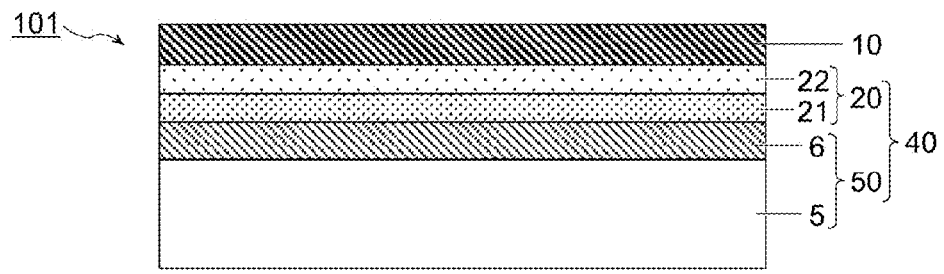
FIG. 1 is a cross-sectional view illustrating an example of a stacking configuration of an electroconductive film.

FIG. 1 is a cross-sectional view illustrating an example of a stacking configuration of an electroconductive film used for forming a temperature sensor film. An electroconductive film 101 includes a metal thin-film 10 formed on one principal surface of a flexible substrate 40. The flexible substrate 40 may include a resin film base 50, and may include an underlying layer 20 formed on a metal thin-film-forming surface of the resin film base 50. The resin film base 50 may include a hard coat layer 6 formed on a surface of the resin film 5.

Figure 2:
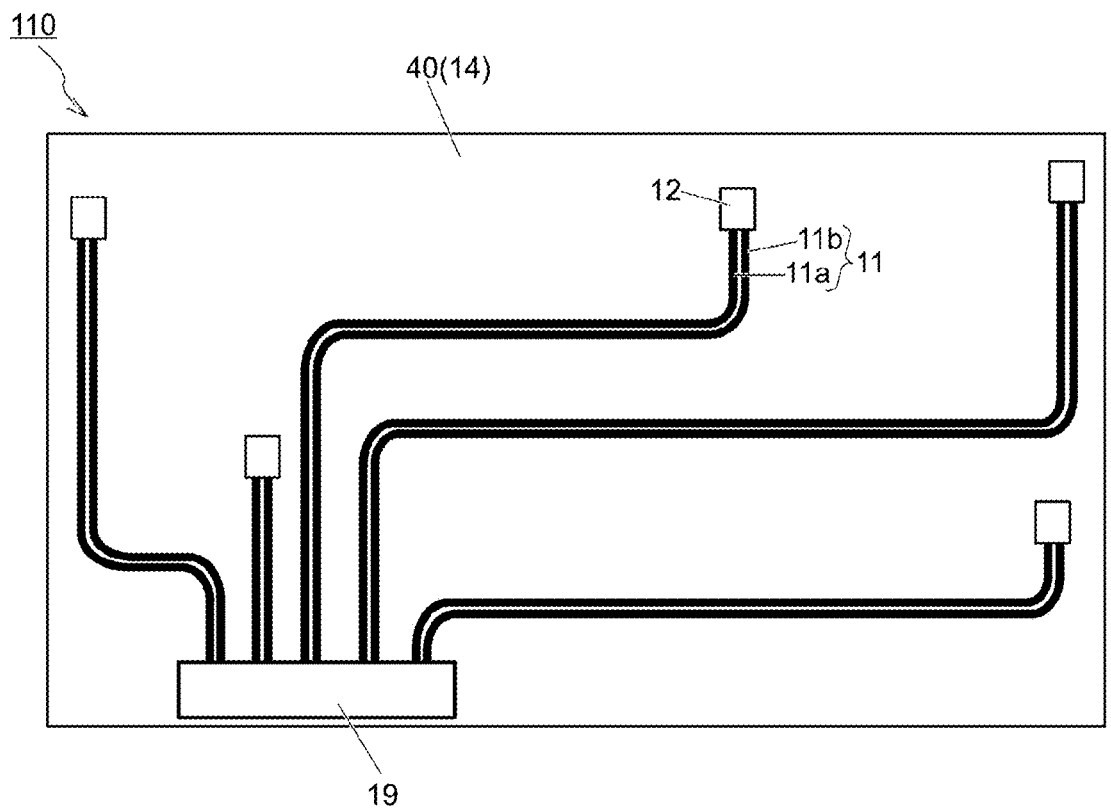
FIG. 2 is a plan view of a temperature sensor film.

A temperature sensor film is formed by patterning the metal thin-film 10 of the electroconductive film 101. As illustrated in FIG. 2, the metal thin-film is patterned to have a lead part 11 formed in a wiring shape and a thermometric resistor part 12 connected to one end of the lead part 11. The other end of the lead part 11 is connected to a connector 19. A method for pattering the metal thin-film is not particularly limited, and may be either wet etching or dry etching. A method for patterning the lead part 11 may be different from a method for patterning the thermometric resistor part 12.

The thermometric resistor part 12 is a region that acts as a temperature sensor, and the temperature measurement is performed by applying a voltage to the thermometric resistor part 12 through the lead part 11 and calculating the temperature from a resistance value thereof. By providing a plurality of thermometric resistor parts in a plane of a temperature sensor film 110, the temperatures at a plurality of locations can be simultaneously measured. For example, in the form illustrated in FIG. 2, the thermometric resistor parts 12 are provided at five locations in the plane.

FIG. 3A is an enlarged view of the vicinity of the thermometric resistor part in a two-wire temperature sensor. The thermometric resistor part 12 is formed by sensor wirings 122 and 123 in which a metal thin-film is patterned into a thin wire shape. In the sensor wiring, a plurality of vertical electrodes 122 are connected at the end thereof through the horizontal wiring 123 to form a hairpin-shaped bent part, thereby having a zigzag pattern.

As the wiring width of the thin wire constituting the pattern shape of the thermometric resistor part 12 is smaller (the cross-sectional area is smaller) and the line length from one end 121*a* to the other end 121*b* of the sensor wiring of the thermometric resistor part 12 is larger, the resistance between two points is larger, and a resistance change amount is also larger according to the change in temperature. Therefore, the temperature measurement accuracy is improved. By forming the zigzag wiring pattern as illustrated in FIGS. 3A and 3B, the area of the thermometric resistor part 12 can be decreased, and the length of the sensor wiring (line length from one end 121*a* to the other end 121*b*) can be increased. The pattern shape of the sensor wiring of the thermometric resistor part is not limited to the form as illustrated in FIGS. 3A and 3B, and may be a pattern shape such as a spiral shape.

The wiring width of the sensor wiring 122 (vertical wiring) and the distance (space width) between adjacent wirings may be set according to the patterning accuracy of photolithography, laser processing, etc. The wiring width and the space width are generally about 1 to 150 μm. The wiring width is preferably 3 μm or more and preferably 5 μm or more from the viewpoint of preventing disconnection of the sensor wiring. The wiring width is preferably 100 μm or less and more preferably 70 μm or less from the viewpoint of increasing the change in resistance and increasing the temperature measurement accuracy. The space width is preferably 3 to 100 μm and more preferably 5 to 70 μm from the same viewpoints.

Both the ends 121*a* and 121*b* of the sensor wiring of the thermometric resistor part 12 are connected to ends of the lead wirings 11*a* and 11*b*, respectively. Two lead wirings 11*a* and 11*b* are formed in an elongated pattern in a state of facing each other with a slight gap, and the other end of the lead wiring is connected to the connector 19. The lead wiring is formed wider than the sensor wiring of the thermometric resistor part 12 in order to secure a sufficient current capacity. Widths of the lead wirings 11*a* and 11*b* are, for example, about 0.5 to 10 mm. The wiring width of the lead wiring is preferably 3 times or more, more preferably 5 times or more, and still more preferably 10 times or more the wiring width of the sensor wiring 122 of the thermometric resistor part 12.

The connector 19 has a plurality of terminals, and a plurality of lead wirings are connected to different terminals, respectively. The connector 19 is connected to an external circuit, and a voltage is applied between the lead wiring 11*a* and the lead wiring 11*b*, such that a current flows through the lead wiring 11*a*, the thermometric resistor part 12, and the lead wiring 11*b*. A resistance value is calculated from a current value when a predetermined voltage is applied, or from an applied voltage when a voltage is applied so that the current becomes a predetermined value. The temperature is calculated from the resistance value based on a relational expression between the obtained resistance value and a temperature obtained in advance, a table in which a relationship between the resistance value and the temperature is recorded, and the like.

In the temperature sensor film, the pattern shape of the metal thin-film is not particularly limited as long as a current can flow through the thermometric resistor part 12 through the lead part 11 and a resistance value in the thermometric resistor part can be read. For example, as illustrated in FIG. 3B, the lead part may be a four-wire shape.

In the form illustrated in FIG. 3B, the pattern shape of the thermometric resistor part 12 is identical to that in FIG. 3A. In the four-wire type, four lead wirings 11*a*1, 11*a*2, 11*b*1, and 11*b*2 are connected to one thermometric resistor part 12. The lead wirings 11*a*1 and 11*b*1 are voltage measurement leads, and the lead wirings 11*a*2 and 11*b*2 are current measurement leads. The voltage measurement lead 11*a*1 and the current measurement lead 11*a*2 are connected to the end 121*a* of the sensor wiring of the thermometric resistor part 12, and the voltage measurement lead 11*b*1 and the current measurement lead 11*b*2 are connected to the other end 121*b* of the sensor wiring of the thermometric resistor part 12. In the four-wire type, the resistance value of only the thermometric resistor part 12 can be measured by excluding the resistance of the lead part, and thus, measurement with less error can be performed. In addition to the two-wire type and the four-wire type, a three-wire type may be adopted.

In the temperature sensor film 110 illustrated in FIG. 2, the metal thin-film is removed and the flexible substrate 40 is exposed in a region 14 other than the lead part 11 and the thermometric resistor part 12, but the metal thin-film may be provided in a region other than the lead part 11 and the thermometric resistor part 12, as long as the resistance value in the thermometric resistor part 12 can be read through the lead part 11. Specifically, when the metal thin-film is patterned so as not to be conducted to the lead part 11 and the thermometric resistor part 12, the metal thin-film 10 in a region other than the lead part 11 and the thermometric resistor part 12 may remain without being removed (FIGS. 6 and 7, and see Patent Document 1 described above).

<Undulation of Temperature Sensor Film>

FIGS. 4 and 5 are cross-sectional views of the vicinity of the lead part 11 and the vicinity of the thermometric resistor part 12 of the temperature sensor film 110, respectively. As described above, in the temperature sensor film 110 illustrated in FIG. 2, the metal thin-film 10 remains in the lead part 11 and the thermometric resistor part 12, and the metal thin-film 10 is removed to expose the flexible substrate 40 in another region 14.

Figure 6:
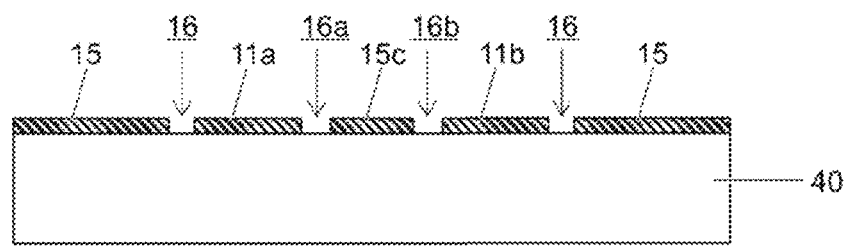
FIG. 6 is a cross-sectional view of the vicinity of the lead part of the temperature sensor film.
Figure 7:
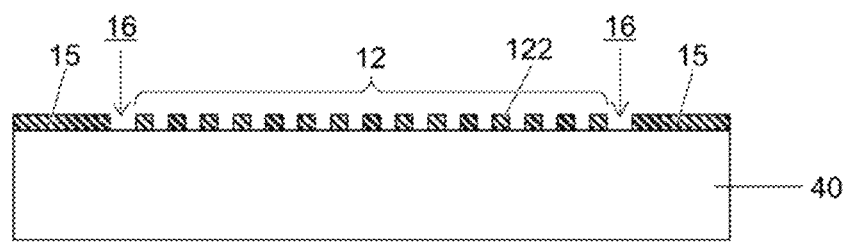
FIG. 7 is a cross-sectional view of the vicinity of the thermometric resistor part of the temperature sensor film.

FIGS. 6 and 7 are cross-sectional views of the temperature sensor film having a remaining part of the metal thin-film 10 in addition to the lead part and the thermometric resistor part. FIG. 6 is a cross-sectional view of the vicinity of the lead part 11, and FIG. 7 is a cross-sectional view of the vicinity of the thermometric resistor part 12. In FIG. 6, a residual piece 15c of the metal thin-film exists in a region sandwiched between a lead wiring 11a and a lead wiring 11b, the lead wiring 11a and the residual piece 15c are separated by a region 16a from which the metal film is removed in a groove shape, and the lead wiring 11b and the residual piece 15c are separated by a region 16b from which the metal film is removed in a groove shape. A remaining part 15 of the metal thin-film also exists outside the lead part, and the metal thin-film of the remaining part is separated from the lead part by the region 16 from which the metal film is removed in a groove shape. In FIG. 7, the metal thin-film removed region 16 exists so as to surround the thermometric resistor part 12, and the metal thin-film remains without being removed in the metal thin-film remaining region 15 on the outer periphery thereof.

In any one of FIGS. 4 to 7, there are a region (the lead wirings 11a and 11b, a sensor wiring (vertical wiring) 122 of the thermometric resistor part 12, and the metal thin-film remaining region 15 electrically separated from the lead wirings and the sensor wiring) in which the metal thin-film is provided on the flexible substrate 40, and regions 14 and 16 in which the metal thin-film is removed and the flexible substrate 40 is exposed.

As described above, when the temperature sensor film is formed by patterning the metal thin-film 10 formed on the flexible substrate 40, a step is present at a boundary between the metal thin-film-provided region and the metal thin-film-non-provided region, and undulation may occur. For example, in the lead part and the vicinity thereof, a step is generated along the boundary between the lead wirings 11a and 11b and the flexible substrate exposed regions 14 and 16, and the lead wirings 11a and 11b (and the residual piece 15c) become convex portions or concave portions, and have a wavy shape along a direction perpendicular to an extending direction of the lead wirings. In the thermometric resistor part and the vicinity thereof, a step is generated along the outer periphery of the thermometric resistor part 12, and undulation in which the thermometric resistor part is formed into a convex portion or a concave portion occurs (see Comparative Example 5 of FIG. 8).

As a result of studying the cause of the occurrence of the undulation in the film after patterning the metal thin-film, it has been determined that the undulation is likely to occur when the film is heated after patterning the metal thin-film by etching or the like. For example, in a case where the metal thin-film is patterned by wet etching, heating and dying are performed after washing an etchant with water. In addition, heating may be performed for reducing resistance or improving temperature coefficient of resistance (TCR) of the metal thin-film.

Focusing on a phenomenon in which the undulation occurs or the undulation is increased due to heating, as a result of conducting studies, the inventors have found that a difference in heating dimensional change rate between the metal thin-film-provided region and the metal thin-film-non-provided region is a factor of the undulation. That is, the difference between the heating dimensional change rate $H_1$ of the region in which the metal thin-film 10 is provided on the flexible substrate 40 and the heating dimensional change rate $H_2$ of the region in which the metal thin-film is removed and the flexible substrate 40 is exposed is one of the factors that cause the undulation, and in a case where the absolute value $|H_2-H_1|$ of the difference between $H_1$ and $H_2$ is small, the undulation in the film after patterning tends to be suppressed.

The heating dimensional change rate (%) is defined by $100\times(L-L_0)/L_0$ using a distance $L_0$ between two points before heating and a distance L between two points after heating. In the present specification, unless otherwise specified, the "heating dimensional change rate" refers to a rate of dimensional change in a predetermined direction before and after heating when the heating is performed at 150° C. for 25 minutes. A positive sign of the heating dimensional change rate indicates expansion, and a negative sign of the heating dimensional change rate indicates shrinkage. $H_2-H_1>0$ means that the metal thin-film-provided region has a smaller dimension after heating (tends to be thermally shrunk) than the metal thin-film-removed region.

In the case where $H_2-H_1>0$, the undulation tends to occur in the film so that the metal thin-film-provided region becomes a concave portion and the metal thin-film-removed region becomes a convex portion. In a case where $H_2-H_1<0$, the undulation tends to occur in the film so that the metal thin-film-provided region becomes a convex portion and the metal thin-film-removed region becomes a concave portion. In the case where $H_2-H_1>0$, it is considered that the heat shrinkage of the metal thin-film is larger than the heat shrinkage of the flexible substrate, such that the heat shrinkage of the metal thin-film-provided region is increased. In the metal thin-film-provided region, stress is generated at the interface between the flexible substrate 40 and the metal thin-film 10, and curl in which the metal thin-film 10-formed surface becomes the inner side is generated. On the other hand, in the metal thin-film-non-provided region, stress is not generated at the interface. Therefore, it is considered that in the temperature sensor film in which the metal thin-film is patterned, wavy undulation occurs such that the side of the metal thin-film in the metal thin-film-provided region becomes the inner side (concave shape).

In the case where $H_2-H_1<0$, it is considered that since the heat shrinkage of the flexible substrate is larger than the heat shrinkage of the metal thin-film, wavy undulation occurs in the metal thin-film-provided region, such that the metal thin-film 10-formed surface is the outer side (convex shape) due to the stress at the interface between the flexible substrate 40 and the metal thin-film 10.

Both the case where $H_2-H_1>0$ and the case where $H_2-H_1<0$, it is considered that as the absolute value of $H_2-H_1$. i.e., $|H_2-H_1|$, is smaller, the stress at the interface between the flexible substrate 40 and the metal thin-film 10 is smaller, such that the undulation is suppressed. In the above description, the example of the case where the flexible substrate and the metal thin-film are heat-shrunk has been described. In contrast, in a case where the flexible substrate and/or the metal thin-film are/is expanded by heating (when the heating dimensional change rate is larger than 0), the undulation tends to be suppressed as $|H_2-H_1|$ is smaller.

When the undulation in the film after patterning the metal thin-film is small or no undulation occurs, the film has excellent handleability and contributes to improvement in productivity and yield of the temperature sensor element. In addition, when the protective film is bonded to the surface of the temperature sensor film, defects such as inclusion of air bubbles in the bonding interface can be suppressed.

$|H_2-H_1|$ is preferably 0.10% or less, more preferably 0.07% or less, and still more preferably 0.05% or less. Since the undulation tends to be decreased as $|H_2-H_1|$ is smaller, $|H_2-H_1|$ is preferably as small as possible, and is ideally 0.

In a case where the rate of dimensional change (thermal shrinkage rate) varies depending on the direction, the difference in heating dimensional change rate in any direction may be in the above range. In a case where the metal thin-film is patterned into a stripe shape, the difference in heating dimensional change rate in the patterning direction (direction in which the patterns are arranged) is preferably in the above range. Ideally, the difference in heating dimensional change rate in all directions is in the above range.

Examples of the method for reducing $|H_2-H_1|$ include a method for reducing residual stress at a deposition interface when the metal thin-film 10 is formed on the flexible substrate 40 and a method for reducing an external action for causing a heating dimensional change to the flexible substrate 40 and/or the metal thin-film 10. In addition, $H_2-H_1$ tends to be increased as the thickness of the metal thin-film is larger.

[Electroconductive Film]

Hereinafter, the configuration and production method of the electroconductive film 101 used for forming the temperature sensor film will be described with reference to FIG. 1.

<Resin Film Base>

The flexible substrate 40 includes a resin film base 50. The resin film base 50 may be transparent or non-transparent. The resin film base 50 may be made of only a resin film, or may include a hard coat layer (cured resin layer) 6 formed on a surface of a resin film 5 as illustrated in FIG. 1. A thickness of the resin film base 50 may be 1 mm or less. From the viewpoint of a balance of strength and flexibility, the thickness of the resin film base 50 is generally about 2 to 500 μm, and preferably about 20 to 300 μm.

An easily adhesive layer, an antistatic layer, and the like may be disposed on a surface of the resin film base 50 (in a case where the hard coat layer 6 is disposed, the surface of the resin film 5 and/or the surface of the hard coat layer 6). The surface of the resin film base 50 may be subjected to a treatment such as a corona discharge treatment, an ultraviolet irradiation treatment, a plasma treatment, or a sputter etching treatment in order to increase adhesion to the underlying layer 20.

(Resin Film)

Examples of a resin material of the resin film 5 include polyester such as polyethylene terephthalate, polyimide, polyolefin, cyclic polyolefin such as norbornene, polycarbonate, polyether sulfone, and polyarylate. Polyimide or polyester is preferable from the viewpoint of heat resistance, dimensional stability, electrical properties, mechanical properties, chemical resistance, and the like. A thickness of the resin film 5 is, although not particularly limited, generally about 2 to 500 μm, and preferably about 20 to 300 μm.

(Hard Coat Layer)

When a hard coat layer 6 is disposed on the surface of the resin film 5, hardness of the electroconductive film is improved so that scratch resistance is improved. The hard coat layer 6 can be formed, for example, by applying a solution containing a curable resin onto the resin film 5.

Examples of the curable resin include a thermosetting resin, an ultraviolet curable resin, and an electron beam curable resin. Examples of the type of curable resin include various resins such as polyester-based, acrylic, urethane-based, acrylic urethane-based, amide-based, silicone-based, silicate-based, epoxy-based, melamine-based, oxetane-based, and acrylic urethane-based resins.

Among them, an acrylic resin, an acrylic urethane-based resin, and an epoxy-based resin are preferable because these resins have high hardness, can be cured by ultraviolet rays, and have excellent productivity. In particular, an acrylic resin and an acrylic urethane-based resin are preferable because these resins have high adhesion to the chromium oxide thin-film included in the underlying layer. The ultraviolet curable resin encompasses ultraviolet curable monomer, oligomer, polymer, etc. Examples of the ultraviolet curable resin preferably used include resins having an ultraviolet polymerizable functional group, and among them, a resin containing, as a component, an acrylic monomer or oligomer having 2 or more, in particular, 3 to 6 ultraviolet polymerizable functional groups can be exemplified.

Fine particles may be contained in the hard coat layer 6. The fine particles are contained in the hard coat layer 6, such that a surface shape of the metal thin-film 10-forming surface of the resin film base 50 (a surface on which the underlying layer 20 to be formed) can be adjusted. As the fine particles, various metal oxide fine particles such as silica, alumina, titania, zirconia, calcium oxide, tin oxide, indium oxide, cadmium oxide, and antimony oxide, glass fine particles, crosslinked or uncrosslinked organic fine particles formed of polymers such as polymethyl methacrylate, polystyrene, polyurethane, an acrylic-styrene copolymer, benzoguanamine, melamine, and polycarbonate, silicone-based fine particles, and the like can be used without particular limitation.

An average particle diameter (average primary particle diameter) of the fine particles is preferably about 10 nm to 10 μm. When the hard coat layer contains fine particles having an average particle diameter in the order of submicron or micrometer (hereinafter, may be referred to as "microparticles"), such as about 0.5 μm to 10 μm, preferably about 0.8 μm to 5 μm, protrusions having a diameter in the order of submicron or micrometer are formed on the surface of the hard coat layer 6 (the surface of the resin film base 50) and the surface of thin-film disposed on the hard coat layer 6, so that slipperiness, blocking resistance, and scratch resistance of the electroconductive film tend to be improved.

When the hard coat layer contains fine particles (nanoparticles) having an average particle diameter of about 10 nm to 100 nm, preferably about 20 to 80 nm, fine irregularities are formed on the surface of the hard coat layer 6 (the surface of the resin film base 50), and adhesion between the hard coat layer 6, the underlying layer 20, and the metal thin-film 10 tends to be improved.

A solution for forming a hard coat layer (hard coat composition) preferably contains an ultraviolet polymerization initiator. Additives such as a leveling agent, a thixotropic agent, and an antistatic agent may be contained in the solution.

A thickness of the hard coat layer 6 is, although not particularly limited, preferably 0.5 µm or more, more preferably 0.8 µm or more, and still more preferably 1 µm or more, in order to realize high hardness. In consideration of ease of formation by application, the thickness of the hard coat layer is preferably 15 µm or less and more preferably 10 µm or less.

<Underlying Layer>

The flexible substrate 40 may include the underlying layer 20 formed on the resin film base 50. The underlying layer 20 may be a single layer, and may have a stacking configuration of two or more thin-films 21 and 22 as illustrated in FIG. 1. The underlying layer 20 may be an organic layer or an inorganic layer, and may be a layer in which an organic layer and an inorganic layer are stacked. It is preferable at least one layer of the underlying layer 20 is an inorganic thin-film, and in particular, the thin-film 22 disposed immediately under the metal thin-film 10 is preferably an inorganic thin-film. By providing the inorganic thin-film as the underlying layer 20, mixing of an organic gas into the metal thin-film 10 from the resin film base 50 tends to be suppressed during formation of the metal thin-film 10, the temperature coefficient of resistance (TCR) of the metal thin-film 10 tends to be increased, and the temperature measurement accuracy in the temperature sensor film is improved.

By providing the underlying layer immediately under the metal thin-film 10, the difference in heating dimensional change rate $|H_2-H_1|$ by the presence or absence of the metal thin-film tends to be reduced. One of the estimation factors of the reduction in difference in heating dimensional change rate by providing the underlying layer is a stress relaxation effect by the underlying layer. For example, by forming an amorphous underlying layer on the resin film base, an effect of alleviating the stress caused by the mismatch of the lattice spacing of the metal thin-film is expected. In addition, the fact that the underlying layer formed on the resin film base acts as a barrier layer is also considered as one of the factors of reducing the difference in heating dimensional change rate. When the underlying layer acts as a barrier layer, mixing of impurities such as moisture and organic matters into the metal thin-film from the resin film base is suppressed. Therefore, it is considered that a metal thin-film having few lattice defects is easily formed, and a dimensional change of the metal thin-film due to rearrangement of atoms or the like during heating hardly occurs, such that the difference in heating dimensional change rate by the presence or absence of the metal thin-film is reduced.

The underlying layer 20 may be electroconductive or insulative. In a case where the thin-film 22 disposed immediately under the metal thin-film 10 is an electroconductive inorganic material (inorganic conductor), the thin-film 21 (or the entire underlying layer 20) may be patterned together with the metal thin-film 10 at the time of producing a temperature sensor film. In a case where the thin-film 21 is an insulating inorganic material (inorganic dielectric), the thin-film 21 may be patterned or may not be patterned.

Examples of the inorganic material include metal elements or semimetal elements such as Si, Ge, Sn, Pb, Al, Ga, In, Tl, As, Sb, Bi, Se, Te, Mg, Ca, Sr, Ba, Sc, Y, Ti, Zr, Hf, V, Nb, Ta, Cr, Mo, W, Mn, Tc, Re, Fe, Ru, Os, Ni, Co, Rh, Ir, Pd, Pt, Cu, Ag, Au, Zn, and Cd, and alloys, nitrides, oxides, carbides, and nitrogen oxides thereof. Since adhesion to both the organic material constituting the hard coat layer 6 and the metal material constituting the metal thin-film 10, such as nickel, is excellent, and the effect of suppressing mixing of impurities into the metal thin-film is high, a silicon-based material or chromium oxide is preferable as the material of the underlying layer.

Examples of the silicon-based material include silicon and silicon compounds such as silicon oxide, silicon nitride, silicon oxynitride, and silicon carbide. Among them, silicon or silicon oxide is preferable because it is excellent in adhesion to the hard coat layer and the metal thin-film and is excellent in an effect of improving bending resistance. From the viewpoint of securing insulation between wirings when the metal thin-film 10 is patterned, the layer 22 formed immediately under the metal thin-film 10 is preferably an inorganic dielectric thin-film such as silicon oxide.

By disposing the thin-film 22 having a high specific resistance such as silicon oxide thin-film under the metal thin-film 10, a leakage current between wirings (patterned metal thin-film) tends to be reduced, and the temperature measurement accuracy of the temperature sensor film tends to be improved. Silicon oxide may be a stoichiometric composition ($SiO_2$) or may be a non-stoichiometric composition ($SiO_x$, x<2). In a non-stoichiometric silicon oxide ($SiO_x$) it is preferable $1.2 \leq x < 2$ is satisfied.

As the underlying layer 20, the silicon oxide thin-film 22 may be formed on the silicon thin-film 21. In addition, the silicon oxide thin-film may be formed on the inorganic thin-film 21 formed of various metals, electroconductive oxide, ceramic, or the like.

A thickness of the underlying layer 20 and a thickness of the thin-film constituting the underlying layer 20 are not particularly limited. The thickness of the underlying layer 20 is preferably 1 nm or more, more preferably 3 nm or more, and still more preferably 5 nm or more, from the viewpoint of suppressing undulation in the film after patterning the metal thin-film, and from the viewpoint of reducing plasma damage to the resin film base and enhancing the effect of blocking outgassing from the resin film base during the formation of the metal thin-film, by the base effect on the metal thin-film 10. The thickness of the underlying layer is preferably 200 nm or less, more preferably 100 nm or less, and still more preferably 50 nm or less, from the viewpoint of improving productivity and reducing material costs.

A method for forming the underlying layer 20 is not particularly limited, and either dry coating or wet coating can be adopted according to the material. In a case where the metal thin-film 10 is formed by a sputtering method, it is preferable that the underlying layer 20 is also formed by the sputtering method from the viewpoint of productivity.

A target may be selected according to the material of the underlying layer, when the underlying layer is formed by a sputtering method. For example, when a silicon thin-film is formed, a silicon target is used. In deposition of the silicon oxide thin-film, a silicon oxide target may be used, or silicon oxide may be formed by reactive sputtering using a silicon target. In the reactive sputtering, it is preferable to adjust the amount of oxygen so as to form an intermediate transition region between the metal region and the oxide region <Metal Thin Film>

The metal thin-film 10 disposed on the flexible substrate 40 plays a central role in the temperature measurement in the temperature sensor. As described above, a temperature sensor film is formed by patterning the metal thin-film 10.

Examples of the metal material constituting the metal thin-film 10 include copper, silver, aluminum, gold, rhodium, tungsten, molybdenum, zinc, tin, cobalt, indium, nickel, iron, platinum, palladium, tin, antimony, bismuth, magnesium, and an alloy thereof. Among them, nickel, copper, or an alloy containing them as a main component (containing 50 wt %/o or more) is preferable, and nickel or a nickel alloy containing nickel as a main component is particularly preferable, in terms of low resistance, a high TCR, and an inexpensive material.

The thickness of the metal thin-film 10 is, although not particularly limited, preferably 20 nm or more from the viewpoint of low resistance (in particular, from the viewpoint of reducing resistance of the lead part), and is more preferably 500 nm or less from the viewpoint of improving patterning accuracy and the like. When the thickness of the metal thin-film 10 is small, the heat shrinkage of the metal thin-film is small, such that $H_2$-$H_1$ tends to be reduced to satisfy $H_2$-$H_1$<0, which tends to cause undulation after patterning the metal thin-film in which the metal thin-film-provided region becomes a convex shape. On the other hand, as the thickness of the metal thin-film 10 is larger, the heat shrinkage of the metal thin-film is increased, $H_2$-$H_1$>0 is likely satisfied, such that undulation in which the metal thin-film-provided region becomes a concave shape tends to occur after the metal thin-film is patterned. In order to suppress the undulation in the temperature sensor film by reducing $|H_2-H_1|$, the thickness of the metal thin-film 10 is preferably 60 to 200 m and more preferably 70 to 180 nm.

In a case where the metal thin-film 10 is a nickel thin-film or a nickel alloy thin-film, a specific resistance at a temperature of 25° C. is preferably $1.6\times10^{-5}$ Ω·cm or less and more preferably $1.5\times10^{-5}$ Ω·cm or less. From the viewpoint of reducing the resistance of the lead part, the specific resistance of the metal thin-film is preferably as small as possible and may be $1.2\times10^{-5}$ Ω·cm or less or $1.0\times10^{-5}$ Ω·cm or less. The specific resistance of the metal thin-film is preferably as small as possible, but it is difficult to make the specific resistance smaller than that of bulk nickel, and the specific resistance is generally $7.0\times10^{-6}$ Ω·cm or more.

The TCR of the metal thin-film 10 is preferably 3,000 ppm/° C. or more, more preferably 3,400 ppm/° C. or more, still more preferably 3,600 ppm ° C. or more, and particularly preferably 3,800 ppm/° C. or more. The TCR is a rate of change in resistance with respect to an increase in temperature. A metal such as nickel or copper has a characteristic (positive characteristic) in which the resistance is linearly increased according to the increase in temperature. The TCR of the material having the positive characteristic is calculated from a resistance value $R_0$ at a temperature $T_0$ and a resistance value $R_1$ at a temperature $T_1$ by the following equation.

$$TCR=\{(R_1-R_0)/R_0\}/(T_1-T_0)$$

As the TCR is larger, the change in resistance with respect to the change in temperature is increased, and the temperature measurement accuracy in the temperature sensor film is improved. Therefore, the TCR of the metal thin-film is preferably as large as possible, but it is difficult to make the TCR larger than that of a bulk metal, and the TCR of the metal thin-film is generally 6,000 ppm/° C. or less.

A method for forming the metal thin-film is not particularly limited, and for example, a deposition method such as a sputtering method, a vacuum deposition method, an electron beam deposition method, a chemical vapor deposition method (CVD), a chemical solution deposition method (CBD), or a plating method can be adopted. Among them, a sputtering method is preferable because a thin-film having excellent film thickness uniformity can be formed. By performing deposition while continuously moving the long resin film base in a longitudinal direction using a roll-to-roll sputtering apparatus, productivity of the electroconductive film is increased.

In deposition of the metal thin-film by roll-to-roll sputtering, it is preferable that a roll-shaped film base is loaded in the sputtering apparatus, and then, inside of the sputtering apparatus is exhausted before the start of the sputtering deposition to obtain an atmosphere in which impurities such as an organic gas generated from the film base are removed. By removing the gas in the apparatus and the film base in advance, the amount of moisture, organic gas, or the like mixed into the metal thin-film 10 can be reduced. A degree of vacuum (degree of ultimate vacuum) in the sputtering apparatus before the start of the sputtering deposition is, for example, $1\times10^{-1}$ Pa or less, preferably $5\times10^{-2}$ Pa or less, and more preferably $1\times10^{-2}$ Pa or less.

In sputtering deposition of the metal thin-film, a metal target is used, and the deposition is performed while an inert gas such as argon is introduced. For example, in a case where a nickel thin-film is formed as the metal thin-film 10, a metal Ni target is used.

The sputtering deposition conditions are not particularly limited. In order to suppress mixing of moisture, an organic gas, or the like into the metal thin-film, it is preferable to reduce damage to the resin film base during deposition of the metal thin-film. By disposing the underlying layer 20 on the resin film base 50 and forming the metal thin-film 10 on the underlying layer 20, plasma damage to the resin film base 50 during deposition of the metal thin-film 10 can be suppressed. In addition, by disposing the underlying layer 20, moisture, an organic gas, or the like generated from the resin film base 50 can be blocked, and mixing of moisture, an organic gas, or the like into the metal thin-film 10 can be suppressed.

In addition, generation of moisture or an organic gas from the resin film base can be suppressed by lowering the substrate temperature during deposition and lowering a discharge power density. The substrate temperature in the sputtering deposition of the metal thin-film is preferably 200° C. or lower, more preferably 180° C. or lower, and still more preferably 170° C. or lower. On the other hand, the substrate temperature is preferably −30° C. or higher from the viewpoint of prevention of embrittlement of the resin film base and the like. From the viewpoint of suppressing damage to the resin film base while stabilizing plasma discharge, the discharge power density is preferably 1 to 15 W/cm$^2$ and more preferably 1.5 to 10 W/cm$^2$.

[Production of Temperature Sensor Film]

As described above, a temperature sensor film can be produced by patterning the metal thin-film 10 of the electroconductive film. A method for patterning the metal thin-film is not particularly limited. Since the patterning is easy and accuracy is high, it is preferable to perform patterning by a photolithography method or laser processing. In the photolithography, an etching resist corresponding to the shapes of the lead part and the thermometric resistor part are formed on the surface of the metal thin-film, the metal thin-film in a region in which the etching resist is not formed is removed by wet etching, and then, the etching resist is peeled off. The patterning of the metal thin-film can also be performed by dry etching such as laser processing.

As described above, the electroconductive film of the present invention has a small absolute value of the difference between the heating dimensional change rate $H_1$ of the electroconductive film before patterning the metal thin-film and the heating dimensional change rate $H_2$ of the film from which the metal thin-film is removed from the electroconductive film. Therefore, in the temperature sensor film after patterning the metal thin-film, an absolute value of a difference $h_2-h_1$ between the heating dimensional change rate $h_1$ in the metal thin-film-non-provided region and the heating dimensional change rate $h_2$ in the metal thin-film-non-provided region is small. Therefore, even when beating is performed at time of drying or the like after washing the etchant with water, the occurrence of the undulation caused by the difference in heating dimensional change is suppressed.

$|h_2-h_1|$ is preferably 0.10% or less, more preferably 0.07% or less, and still more preferably 0.05% or less. Since the undulation tends to be decreased as $|h_2-h_1|$ is smaller, $|h_2-h_1|$ is preferably as small as possible, and is ideally 0.

As described above, a plurality of each of lead parts and thermometric resistor parts can be formed in the plane of the substrate by forming the metal thin-film 10 on the flexible substrate 40 by a sputtering method or the like, and patterning the metal thin-film. A temperature sensor element is obtained by connecting the connector 19 to the end of the lead part 11 of the temperature sensor film. In the embodiment illustrated in FIG. 2, the lead parts are connected to the plurality of thermometric resistor parts, and the plurality of lead parts may be connected to one connector 19. Therefore, it is possible to easily form a temperature sensor element capable of measuring temperatures at a plurality of locations in the plane.

A method for connecting the lead part of the temperature sensor film and the external circuit is not limited to the connection through the connector. For example, a controller for applying a voltage to the lead part and measuring the resistance may be provided on the temperature sensor film. In addition, the lead part and the lead wiring from the external circuit may be connected by soldering or the like without through the connector.

The temperature sensor film has a simple configuration in which a metal thin-film is disposed on a flexible substrate, and has excellent productivity. In an embodiment of the present invention, since the undulation after patterning the metal thin-film is suppressed, handleability is excellent.

EXAMPLES

Hereinafter, the present invention will be described in more detail with reference to Examples, but the present invention is not limited to the following Examples.

Example 1

<Production of Film Base with Hard Coat Layer>

A coating composition containing crosslinked polymethyl methacrylate particles having an average particle diameter of 1.5 μm ("TECHPOLYMER SSX-101" manufactured by Sekisui Kasei Co., Ltd.) and an ultraviolet curable urethane acrylate resin ("Aica Aitron Z844-22HL" manufactured by Aica Kogyo Company, Limited) and using methyl isobutyl ketone as a solvent was prepared. The amount of particles in the composition was 0.2 parts by weight with respect to 100 parts by weight of the solid content in the binder resin. The composition was applied to one surface of a polyethylene terephthalate (PET) film having a thickness of 150 μm ("Lumirror 149UNS" manufactured by Toray Industries), and drying was performed at 100° C. for 1 minute. Thereafter, a curing treatment was performed by ultraviolet irradiation to form a hard coat layer having a thickness of 0.8 μm.

<Formation of Metal Thin Film>

A roll of a hard coat layer-equipped film base was set in a roll-to-roll sputtering apparatus, the inside of the sputtering apparatus was exhausted until a degree of ultimate vacuum reached $5 \times 10^{-3}$ Pa, and then, argon as a sputtering gas was introduced, thereby forming a nickel thin-film having a thickness of 70 nm on the hard coat layer-formed surface by DC sputtering under conditions of a substrate temperature of 40° C., a pressure of 0.25 Pa, and a power density of 5.0 W/cm².

Example 2

An electroconductive film having a nickel thin-film formed on a hard coat layer was produced in the same manner as that of Example 1, except that the substrate temperature during deposition the nickel thin-film was changed to 80° C.

Example 3

A hard coat layer-equipped film base was prepared and set in a roll-to-roll sputtering apparatus, the inside of the sputtering apparatus was exhausted until a degree of ultimate vacuum reached $5 \times 10^{-3}$ Pa, and then, a silicon thin-film having a thickness of 5 nm, a silicon oxide thin-film having a thickness of 10 nm, and a nickel thin-film having a thickness of 70 nm were sequentially deposited on the hard coat layer-formed surface at a substrate temperature of 150° C. by DC sputtering in the same manner as that of Example 1, thereby producing an electroconductive film having a nickel thin-film on the hard coat layer with a silicon thin-film and the silicon oxide thin-film as an underlying layer interposed therebetween. A B-doped Si target was used to form the Si layer and the $SiO_2$ layer. The Si layer was deposited by introducing argon as a sputtering gas under conditions of a pressure of 0.3 Pa and a power density of 1.0 W/cm². The $SiO_2$ layer was deposited by introducing oxygen as a reactive gas ($O_2/Ar=0.12/1.0$) in addition to argon as a sputtering gas under conditions of a pressure of 0.3 Pa and a power density of 1.8 W/cm². The deposition conditions of the nickel thin-film were the same as those of Example 1, except that the substrate temperature was changed to 150° C.

Example 4

An electroconductive film having a nickel thin-film formed on a hard coat layer with a silicon thin-film and a silicon oxide thin-film as an underlying layer interposed therebetween was produced in the same manner as that of Example 3, except that the substrate temperature was changed to 80° C. and the thickness of the nickel thin-film was changed to 160 nm.

Example 5

An electroconductive film having nickel thin-film formed on a hard coat layer with a chromium thin-film and a silicon oxide thin-film as an underlying layer interposed therebetween was produced in the same manner as that of Example 3, except that a chromium oxide thin-film having a thickness of 5 nm was formed instead of the silicon thin-film. In formation of the chromium oxide thin-film, a metal chromium target was used, argon was introduced as a sputtering gas, and deposition was performed under conditions of a pressure of 0.25 Pa and a power density of 0.74 W/cm².

Example 6

An electroconductive film having nickel thin-film formed on a hard coat layer with an indium tin oxide (ITO) thin-film and a silicon oxide thin-film as an underlying layer interposed therebetween was produced in the same manner as that of Example 3, except that an ITO thin-film having a thickness of 5 nm was formed instead of the silicon thin-film. In formation of the ITO thin-film, a sintered target of indium tin oxide was used, oxygen was introduced ($O_2$/Ar=0.12/1.0) in addition to argon as a sputtering gas, and deposition was performed under conditions of a pressure of 0.19 Pa and a power density of 1.82 W/cm$^2$.

Example 7

An electroconductive film having nickel thin-film formed on a hard coat layer with an aluminum doped zinc oxide (AZO) thin-film and a silicon oxide thin-film as an underlying layer interposed therebetween was produced in the same manner as that of Example 3, except that an AZO thin-film having a thickness of 10 nm was formed instead of the silicon thin-film. In formation of the AZO thin-film, a sintered target of indium tin oxide was used, oxygen was introduced ($O_2$/Ar=0.12/1.0) in addition to argon as a sputtering gas, and deposition was performed under conditions of a pressure of 0.19 Pa and a power density of 0.75 W/cm$^2$.

Comparative Example 1

An electroconductive film having a nickel thin-film formed on a hard coat layer with a silicon thin-film and a silicon oxide thin-film as an underlying layer interposed therebetween was produced in the same manner as that of Example 4, except that the thickness of the nickel thin-film was changed to 50 nm.

Comparative Example 2

An electroconductive film having a nickel thin-film formed on a hard coat layer was produced in the same manner as that of Example 2, except that the thickness of the nickel thin-film was changed to 220 nm.

Comparative Example 3

An electroconductive film having a nickel thin-film formed on a hard coat layer was produced in the same manner as that of Example 2, except that the thickness of the nickel thin-film was changed to 260 nm.

[Evaluation]

<Rate of Heating Dimensional Change>

A square test piece of 100 mm×100 mm was cut out from the electroconductive film, four mark points (scratches) were formed at intervals of 80 mm in MD (conveyance direction during the sputtering deposition) and TD (direction perpendicular to the MD), and a distance $L_0$ between the mark points was measured by a surface coordinate measuring machine ("CP600S" manufactured by TOPCON CORPORATION, an optical equipment manufacturer). After the test piece was left in a heating oven at 155° C. for 25 minutes, the test piece was cooled to room temperature, and a distance L between the mark points was measured. An average of heating dimensional change rates at two locations in each of the MD and TD was defined as a heating dimensional change rate $H_1$ of the electroconductive film.

A square test piece of 100 mm×100 mm was cut out from the electroconductive film, and the cut test piece was immersed in hydrochloric acid to remove the nickel thin-film by etching. Thereafter, in the same manner as described above, a heating dimensional change rate $H_2$ after heating at 155° C. in the MD and TD for 25 minutes was measured.

<Undulation Amount>

A square test piece of 70 mm×70 mm was cut out from the electroconductive film, and a 2 mm-width polyimide tape was bonded to the surface of the nickel thin-film in a stripe shape at intervals of 2 mm. The test piece was immersed in hydrochloric acid to remove the nickel thin-film by etching in a region on which the polyimide tape was not bonded, the test piece was washed with water by immersion in pure water, and the polyimide tape was slowly peeled off thereafter. The test piece was left in a heating oven at 155° C. for 25 minutes and cooled to room temperature. In each of a case where the MD is the patterning direction (in a case where the polyimide tape is bonded so as to extend in the TD) and in a case where the TD is the patterning direction (in a case where the polyimide tape is bonded so as to extend in the MD), a three-dimensional surface shape was measured by a coherence scanning interferometer (ZYGO NEWVIEW™ 7300) under the following conditions, and a maximum value of a height difference between peaks and valleys adjacent to each other in the patterning direction was defined as an undulation amount. In a case where a portion the nickel thin-film being provided was a concave portion (valley), the sign of the undulation amount was positive, and in a case where a portion the nickel thin-film being provided was a convex portion (peak), the sign of the undulation amount was negative.

(Measurement Conditions)

Objective lens: 2.5 times, zoom lens: 1 time

Measurement visual field: 10 mm×5 mm

Removed: Cylinder

Filter: OFF

Filter Type: AVERAGE

Remove spikes: OFF

Spike Height (xRMS): 2.50

<Evaluation of Undulation by Laser Patterning>

The electroconductive films of Example 4 and Comparative Example 2 were used as samples, the nickel thin-film of the electroconductive film was patterned into a stripe shape (L/S=30 μm/30 μm) having a wiring width of 30 μm by laser patterning, and the patterned nickel thin-film was visually observed under a fluorescent lamp to confirm the presence or absence of a strain of a reflection image on the surface of the nickel thin-film.

[Evaluation Results]

Figure 8:
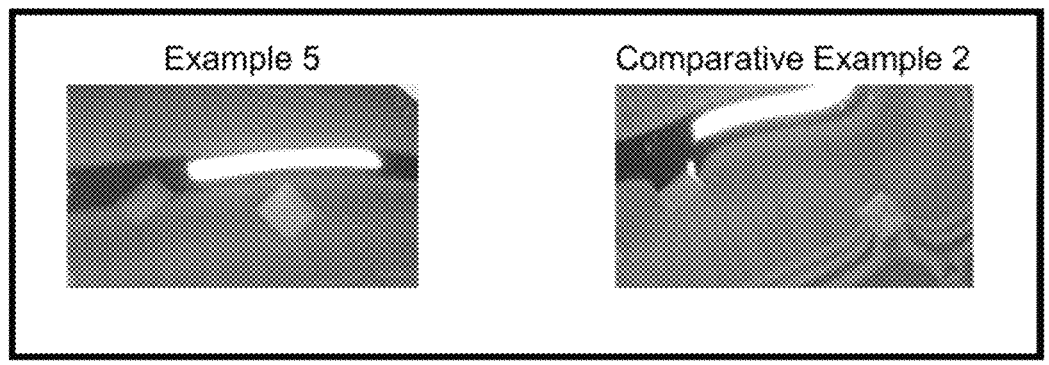
FIG. 8 is a photograph obtained by observing the electroconductive film in which the metal thin-film is patterned by a laser under a fluorescent lamp.

Table 1 shows the followings for Examples and Comparative Examples: the configurations of the electroconductive films (the configuration of the underlying layer, the thickness of the nickel thin-film, and the substrate temperature); the heating dimensional change rate in the MD and the undulation amount in the case where the MD is the patterning direction; and the heating dimensional change rate in the TD and the undulation amount in the case where the TD is the patterning direction. In addition, the observation images of the samples obtained by laser patterning the electroconductive films of Example 4 and Comparative Example 2 under a fluorescent lamp are illustrated in FIG. 8.

TABLE 1

| | | Ni Thin-film | | MD | | | | TD | | | |
|---|---|---|---|---|---|---|---|---|---|---|---|
| | | Substrate Temperature | Thickness | Heating Dimensional Change Rate (%) | | | undulation | Heating Dimensional Change Rate (%) | | | undulation |
| | Underlying Layer | (° C.) | (nm) | $H_1$ | $H_2$ | $H_2 - H_1$ | (μm) | $H_1$ | $H_2$ | $H_2 - H_1$ | (μm) |
| Example 1 | — | 40 | 70 | −0.25 | −0.25 | 0 | 1.2 | −0.01 | 0.01 | 0.02 | −1.4 |
| Example 2 | — | 80 | 70 | −0.39 | −0.38 | 0.01 | 0.6 | −0.03 | 0 | 0.03 | 1.2 |
| Example 3 | Si (5 nm)/SiO$_2$ (10 nm) | 150 | 70 | −0.37 | −0.39 | −0.02 | −6.0 | −0.09 | −0.11 | −0.02 | −3.6 |
| Example 4 | Si (5 nm)/SiO$_2$ (10 nm) | 80 | 160 | −0.28 | −0.30 | −0.02 | −4.0 | 0.01 | 0.01 | 0 | −0.9 |
| Example 5 | Cr (5 nm)/SiO$_2$ (10 nm) | 150 | 160 | −0.41 | −0.38 | 0.03 | 5.2 | −0.01 | 0 | 0.01 | 6.0 |
| Example 6 | ITO (5 nm)/SiO$_2$ (10 nm) | 150 | 160 | −0.41 | −0.35 | 0.06 | 5.2 | −0.01 | 0.01 | 0.02 | 8.7 |
| Example 7 | AZO (10 nm)/SiO$_2$ (10 nm) | 150 | 160 | −0.39 | −0.37 | 0.02 | 4.4 | −0.02 | 0 | 0.02 | 5.9 |
| Comparative Example 1 | Si (5 nm)/SiO$_2$ (10 nm) | 80 | 50 | −0.18 | −0.30 | −0.12 | −12.0 | 0.01 | 0.01 | 0 | −0.9 |
| Comparative Example 2 | — | 80 | 220 | −0.47 | −0.34 | 0.13 | 10.6 | −0.08 | 0.04 | 0.12 | 19.2 |
| Comparative Example 3 | — | 80 | 260 | −0.48 | −0.36 | 0.12 | 10.6 | −0.12 | 0.04 | 0.16 | 20.4 |

Focusing on the values of heating dimensional change rate in Table 1, in all Examples and Comparative Examples, the heating shrinkage in the MD tended to be larger than that in the TD. It is considered that this is because all the production of the resin film and the formation of the hard coat layer, the underlying layer, and the metal thin-film on the resin film were performed by a roll-to-roll process, and the film was stretched along the MD due to the tension during conveyance, and thus, when heating is performed in a state where the tension is not applied, the film is easily shrunk in the MD.

Focusing on the relationship between the heating dimensional change rate and the undulation of Table 1, there was no clear correlation between the numerical values of $H_1$ and $H_2$ and the undulation amount. On the other hand, there was a correlation between $|H_2-H_1|$ and the undulation amount, and the absolute value of the undulation amount tended to be increased as $|H_2-H_1|$ was larger. In addition, in a case where $H_2-H_1$ was a positive value, the sign of the undulation amount tended to be positive (undulation in which the region the nickel thin-film being provided was a valley), and in a case where $H_2-H_1$ was a negative value, the sign of the undulation amount tended to be negative (undulation in which the region the nickel thin-film being provided was a peak).

In FIG. 8, it can be seen that the reflection image of the fluorescent lamp is linear in Example 5, whereas the reflection image of the fluorescent lamp is distorted around the patterning region and undulation occurs in Comparative Example 2. From these results, it can be seen that not only in the case of patterning the metal thin-film by wet etching, but also in the case of patterning the metal thin-film by a dry process such as laser processing, the undulation tends to be suppressed as $|H_2-H_1|$ was smaller.

DESCRIPTION OF REFERENCE SIGNS

40 flexible substrate
50 resin film base
5 resin film
6 hard coat layer
20 underlying layer
10 metal thin-film (nickel thin-film)
11 lead part
12 thermometric resistor part
122, 123 sensor wiring
14 metal thin-film removed region
15 metal thin-film remaining region
19 connector
101 electroconductive film
110 temperature sensor film

The invention claimed is:

1. An electroconductive film for a temperature sensor, the electroconductive film comprising: a flexible substrate including a resin film; and metal thin-film disposed on a first principal surface of the flexible substrate, wherein
   a thickness of the flexible substrate is 1 mm or less, and an absolute value $|H_2-H_1|$ of difference between $H_1$ and $H_2$ is 0.10% or less, wherein $H_1$ is a dimensional change rate when the electroconductive film is heated at 150° C. for 25 minutes, and $H_2$ is a dimensional change rate when a film obtained by removing the metal thin-film from the electroconductive film is heated at 150° C. for 25 minutes;
   wherein the flexible substrate includes an underlying layer formed of an inorganic thin-film, and the underlying layer is in direct contact with the metal thin-film.

2. The electroconductive film according to claim 1, wherein the flexible substrate includes a hard coat layer arranged on a first principal surface of the resin film.

3. The electroconductive film according to claim 1, wherein the underlying layer includes at least one layer of a silicon-based thin-film.

4. The electroconductive film according to claim 3, wherein the metal thin-film is in direct contact with the silicon-based thin-film.

5. The electroconductive film according to claim 1, wherein the metal thin-film has a thickness of 60 to 200 nm.

6. The electroconductive film according to claim 1, wherein the metal thin-film is formed of nickel or a nickel alloy.

7. A method for producing the electroconductive film set forth in claim 1, the method comprising depositing the metal thin-film by a sputtering method.

8. A temperature sensor film comprising: a flexible substrate; and a patterned metal thin-film disposed on a first principal surface of the flexible substrate, wherein
   the metal thin-film is patterned to form a thermometric resistor part patterned into a thin wire and used for measuring a temperature and a lead part connected to the thermometric resistor part and patterned to have a larger wiring width than that of the thermometric resistor part, and an absolute value $|h_2-h_1|$ of a difference between $h_1$ and $h_2$ is 0.10% or less, wherein $h_1$ is a dimensional change rate when a region in which the metal thin-film is provided is heated at 150° C. for 25 minutes, and $h_2$ is a dimensional change rate when a region in which the metal thin-film is not provided is heated at 150° C. for 25 minutes;

wherein the flexible substrate includes an underlying layer formed of an inorganic thin-film, and the underlying layer is in direct contact with the metal thin-film.

9. A method for producing a temperature sensor film, wherein the temperature sensor film comprising: a flexible substrate; and a patterned metal thin-film disposed on a first principal surface of the flexible substrate, wherein the metal thin-film is patterned to form a thermometric resistor part patterned into a thin wire and used for measuring a temperature and a lead part connected to the thermometric resistor part and patterned to have a larger wiring width than that of the thermometric resistor part, the method comprising patterning the metal thin-film of the electroconductive film set forth in claim 1 by removing the metal thin-film in an in-plane partial region, thereby forming the thermometric resistor part and the lead part.

* * * * *